(12) United States Patent
Ding et al.

(10) Patent No.: US 11,888,546 B2
(45) Date of Patent: Jan. 30, 2024

(54) DATA OVER POWER LINE DESIGN

(71) Applicant: Google LLC, Mountain View, CA (US)

(72) Inventors: Yao Ding, San Jose, CA (US); Hui Li, Mountain View, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/722,963

(22) Filed: Dec. 20, 2019

(65) Prior Publication Data

US 2020/0127702 A1    Apr. 23, 2020

Related U.S. Application Data

(63) Continuation of application No. 16/025,597, filed on Jul. 2, 2018, now Pat. No. 10,541,726.

(51) Int. Cl.
*H04B 3/54*    (2006.01)
*H03K 5/24*    (2006.01)

(52) U.S. Cl.
CPC ............... *H04B 3/54* (2013.01); *H03K 5/24* (2013.01)

(58) Field of Classification Search
CPC .. H03G 1/007; H02J 50/80; H02J 2007/0062; H02J 2007/006; H02J 7/0052; H02J 7/0054; H02J 7/0044; H04B 5/0037; H01M 2220/30; H04R 2420/09
See application file for complete search history.

(56) References Cited

U.S. PATENT DOCUMENTS

| | | | |
|---|---|---|---|
| 4,076,961 A | 2/1978 | Holsinger et al. | |
| 4,621,170 A | 11/1986 | Picandet | |
| 6,404,761 B1 | 6/2002 | Snelling et al. | |
| 6,421,430 B1 | 7/2002 | Hollenbach et al. | |
| 6,567,474 B1 | 5/2003 | Bullock et al. | |

(Continued)

FOREIGN PATENT DOCUMENTS

| | | |
|---|---|---|
| CN | 102263715 A | 11/2011 |
| CN | 103368270 A | 10/2013 |
| EP | 2770605 A1 | 8/2014 |

OTHER PUBLICATIONS

International Search Report and Written Opinion for International Application No. PCT/US2019/040055 dated Sep. 19, 2019. 13 pages.

(Continued)

*Primary Examiner* — Aristocratis Fotakis
(74) *Attorney, Agent, or Firm* — Colby Nipper PLLC

(57) ABSTRACT

A first device provides both power and data to a second device over a power line connection between the two devices. The first device includes a power line extending from a power supply, a ground line extending from a ground, a first impedance in the power line, and a second impedance in the ground line. A modulator comprised of a transistor and modulator impedance is between the first impedance and the second impedance, and a tank capacitor is between the power line and the ground line, outside the first impedance and second impedance. A comparator is coupled between the first and second impedance. A switch may be included to short out the first and second impedance, thereby enabling transmission of only power for period of time, and return to a mode of transmitting both data and power. The first device may also receive data from the second device over the power line connection.

16 Claims, 7 Drawing Sheets

(56) References Cited

U.S. PATENT DOCUMENTS

| | | | |
|---|---|---|---|
| 9,342,058 B2 | 5/2016 | Koski et al. | |
| 10,541,726 B1 | 1/2020 | Ding et al. | |
| 2001/0045873 A1 | 11/2001 | Suzuki et al. | |
| 2003/0166408 A1* | 9/2003 | Zhang | H04W 72/121 455/522 |
| 2004/0251878 A1 | 12/2004 | Veselic | |
| 2007/0182397 A1 | 8/2007 | Deguchi | |
| 2008/0183909 A1* | 7/2008 | Lim | G06F 13/4081 710/14 |
| 2008/0244109 A1* | 10/2008 | Lee | G06F 13/385 710/19 |
| 2008/0303486 A1 | 12/2008 | Kao et al. | |
| 2009/0027003 A1 | 1/2009 | Adelman et al. | |
| 2009/0295339 A1 | 12/2009 | Wong | |
| 2010/0085101 A1 | 4/2010 | Walker et al. | |
| 2010/0118983 A1 | 5/2010 | Weber et al. | |
| 2011/0007929 A1 | 1/2011 | Rabu et al. | |
| 2012/0268080 A1 | 10/2012 | Jeon et al. | |
| 2013/0029595 A1* | 1/2013 | Widmer | H04B 5/0031 455/39 |
| 2015/0048804 A1 | 2/2015 | Toivanen et al. | |
| 2015/0106920 A1 | 4/2015 | Li et al. | |
| 2016/0004285 A1* | 1/2016 | Tsai | G06F 1/305 713/300 |
| 2016/0099821 A1* | 4/2016 | Streit | H04L 25/0212 375/257 |
| 2017/0094399 A1* | 3/2017 | Chandramohan | H04R 5/033 |
| 2017/0265019 A1* | 9/2017 | Mannan | G06F 16/16 |
| 2018/0091884 A1* | 3/2018 | Minoo | H02J 7/0042 |
| 2019/0273980 A1* | 9/2019 | Hardi | H04R 1/1025 |
| 2020/0007190 A1 | 1/2020 | Ding et al. | |

OTHER PUBLICATIONS

International Preliminary Report on Patentability for International Application No. PCT/US2019/040055 dated Jan. 14, 2021. 8 pages.

Notification of the First Office Action for Chinese Patent Application No. 201980023183.X dated Mar. 29, 2021. 8 pages.

Notification of the Second Office Action for Chinese Patent Application No. 201980023183.X dated Nov. 19, 2021. 6 pages.

Notice of Grant for Chinese Patent Application No. 201980023183.X dated Apr. 8, 2022. 4 pages.

"Non-Final Office Action", U.S. Appl. No. 16/025,597, dated May 15, 2019, 14 pages.

"Notice of Allowance", U.S. Appl. No. 16/025,597, dated Sep. 12, 2019, 9 pages.

* cited by examiner

DATA OVER POWER LINE DESIGN

CROSS-REFERENCE TO RELATED APPLICATIONS

The present application is a continuation of U.S. patent application Ser. No. 16/025,597, filed Jul. 2, 2018, the disclosure of which is incorporated herein by reference.

BACKGROUND

When transferring signals between two electronic devices, it is preferable to minimize a number of contacts between the devices. For example, reducing a number of pins on charging/data cables for mobile devices, as well as a number of contacts in the mobile devices, helps to provide more room for other technology in the mobile device. This is particularly true for small form factor devices, such as smartwatches, earbuds, Bluetooth headsets, head-mounted displays, etc. Moreover, an increased number of contacts increases a possibility of error and reduces reliability. For example, an increased number of contacts results in an increased probability that one of the contacts will become damaged or worn out or otherwise defective. However, because various types of signals typically need to be transmitted, such as power signals, data signals, control signals, etc., reducing the number of contacts can be quite challenging. Further challenges are presented by reducing a size of the contacts.

In some systems, data can be transmitted over existing AC electrical distribution wiring between transformers, and electrical wiring between transformer and customer outlets. In these systems, a modulated carrier signal is added to the wiring system. However, power wire circuits require insertion of a bulky inductive impedance, complex modulation, and complex demodulations. They have limited applications.

SUMMARY

In a power sourcing device (PS) used to supply power to a power receiving device (PRD), impedances are inserted into power and ground lines on the PSD side and the PRD side. A filter is added before the impedance on each side, and a current pull on either the PSD or the PRD creates step signals on impedances on both sides to allow communication therebetween. Differential mode direct binary phase-shift keying (PSK) may be used to attain excellent noise immunity. A signal detection comparator can be powered directly from the power and ground lines. Manchester coding may be used to recover the clock and data.

One aspect of the disclosure provides a power source device including circuitry for providing data over a power line connection to a power receiver device. The power source device includes a power line extending from a power supply at the source device, a ground line extending from a ground at the source device, a first impedance inserted into the power line, a second impedance inserted into the ground line, a modulator comprised of a transistor and modulator impedance between the first impedance and the second impedance, a tank capacitor between power line and ground line, outside the first impedance and second impedance, and a comparator coupled between the first and second impedance. The modulator may cause current fluctuations across the power line and ground line. The system may be adapted to use differential mode direct binary phase shift keying. The tank capacitor stabilizes voltage across the power line. The first impedance and second impedance create a voltage dip, and the comparator is adapted to detect the voltage dip. The comparator may be powered directly from ground and power lines. The power source device may be configured to encode the data prior to transmission over the power line. The power source device may further be configured to receive data over the power line from the power receiver device, and to decode the data received over the power line from the power receiver device. It may further include a switch configured to short out the first impedance and the second impedance.

Another aspect of the disclosure provides a system, including a first device including a first set of contacts, and a second device including a second set of contacts, the second set of contacts adapted to electronically engage with the first set of contacts of the first device to form at least a power and ground lines connection. Each of the first device and the second device include circuitry for providing data over the power line connection between the first device and the second device. The circuitry includes a power line, a ground line, a first impedance inserted into the power line, a second impedance inserted into the ground line, a modulator comprised of a transistor and modulator impedance between the first impedance and the second impedance, the modulator creating current fluctuations in the power line, a tank capacitor between the power line and the ground line, outside the first impedance and second impedance, and a comparator coupled between the first and second impedance. The first set of contacts may include a first power contact coupled to the power line of the first device and a first ground contact coupled to the ground line of the first device, wherein the second set of contacts includes a second power contact coupled to the power line of the second device and a second ground contact coupled to the ground line of the second device. The modulator causes current fluctuations across the power and ground lines, and the tank capacitor stabilizes voltage across the power line. The first impedance and second impedance create a voltage dip, wherein the comparator is adapted to detect the voltage dip. In some examples, each of the first device and the second device further comprise a switch configured to short out the first impedance and the second impedance. The power source device may be, for example, a case and the power receiver device may be, for example, a corresponding accessory such as a pair of earbuds.

Yet another aspect of the disclosure provides a power receiver device, including a power line, a ground line, a first impedance in the power line, a second in the ground line, a modulator comprised of a transistor and modulator impedance between the first impedance and the second impedance, a tank capacitor between power line and ground line, outside the first impedance and second impedance, and a comparator coupled between the first and second impedance, wherein the device is configured to receive power and data from another device over the power line. The power receiver device may be further configured to transmit data over the power line to the other device. In some examples, the device may include a switch configured to short out the first impedance and the second impedance, wherein the device is configured to automatically activate the switch under predetermined conditions.

DETAILED DESCRIPTION

Overview

Figure 1:
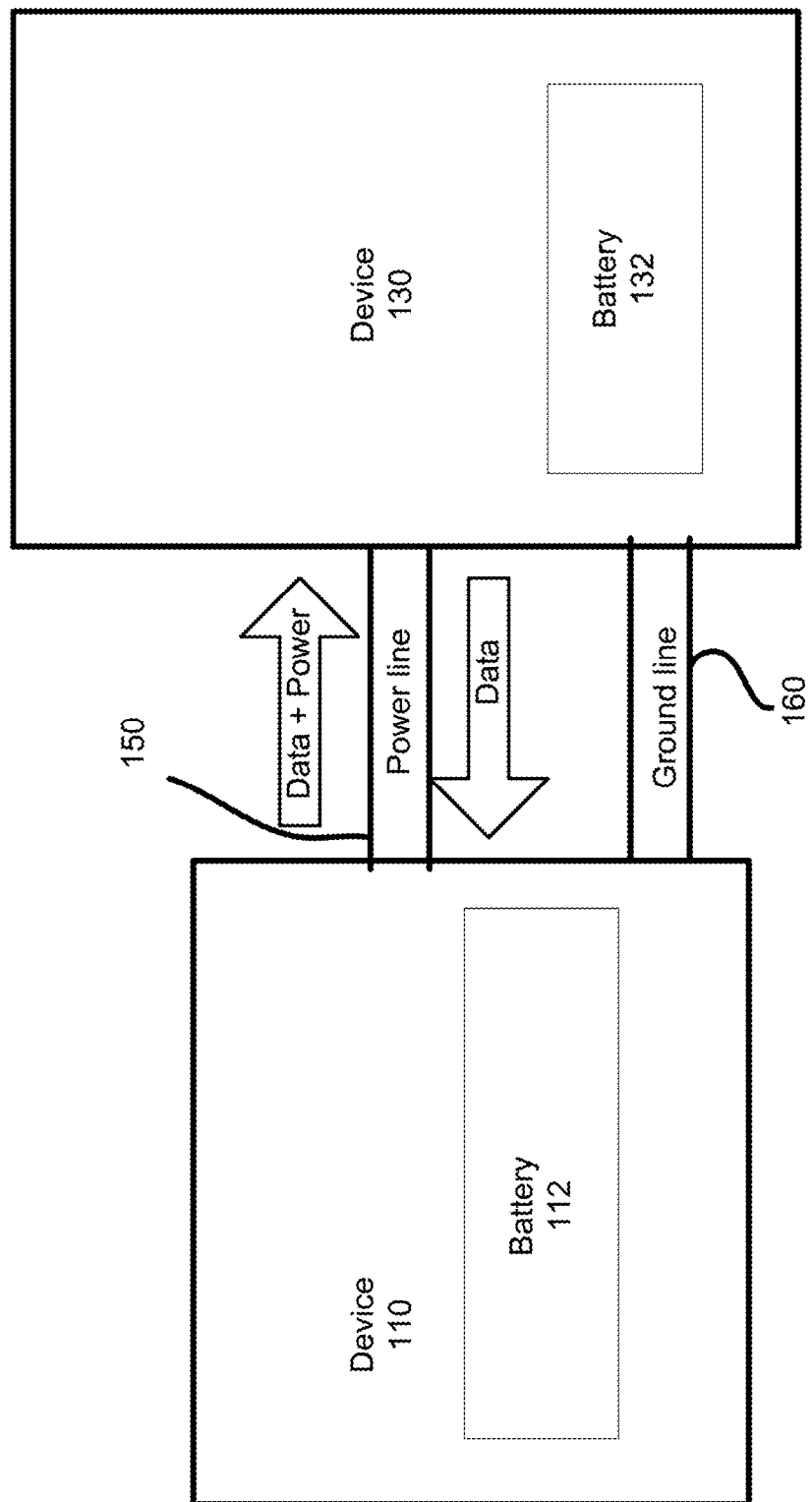
FIG. 1 is a functional block diagram illustrating an example system according to aspects of the disclosure.

The technology relates generally to a circuit design enabling transmission of data over power lines. Such circuitry may be implemented in any of a number of devices where one device provides power to another device. For example, wireless accessories for mobile devices, such as a pair of wireless earbuds, may receive power from a case. According to this disclosure, the circuitry within the case for the earbuds may enable transmission of data from the case to the earbuds through a power line used to charge the earbuds. In this regard, only two contacts are needed between the case and the earbuds: one contact for a power line over which data is transmitted and received, and one contact for ground.

The circuit design includes a power line interface between a power source device (PSD) and a power receiving device (PRD), with resistive impedances inserted into the power line and ground line. The interface may be, for example, a two-line interface, a bus, or any other types of interface adapted to deliver power from the PSD to the PRD.

To inject a modulated signal into the power line, a differential mode direct binary phase shift keying (PSK) may be used. A first resistive impedance is inserted into a power source line, and second resistive impedance is inserted to power return ground. The first and second resistive impedances may have the same resistive values, for example, 0.2 ohm. In other examples, the first resistive impedance may have a different value than the second resistive impedance. The first impedance and second impedance can be up to 10% of the load resistance, to keep power loss below 10% when the first impedance and second impedance are inserted.

In some examples, tank capacitors are also implemented. The tank capacitors help stabilize the voltage across the power line. The tank capacitor value is calculated based on the time constant of the capacitor and inserted impedance. By using a time constant greater than the communication bit period, the voltage across the tank capacitor will not fluctuate when communication is active.

Data bits transmitted or received by the PSD or PRD may be encoded, for example, using Manchester code to facilitate communication clock recovery. By way of example only, as the data is XOR'd with the clock, the pulse widths may be 5 or 10 μs. A signal detection comparator may create an output. The final output is decoded from the comparator output, to remove the Manchester code, and restore the data and clock signals. The comparator can be powered directly from the power and ground lines.

To save additional power, the first impedance and second impedances may be shorted out during times when communication is not active. For example, a manual switch or MOSFET may be implemented. In some examples, the switch may automatically short out the added impedances in response to detected conditions. For example, if the power in one of the devices is low, the added impedances may be shorted out such that data is no longer transmitted by that device. When the conditions change, such as if the charge in the low power device increases above a predetermined threshold, the devices may return to a data transmission mode.

In some examples, identical circuits may be placed in both the PSD and the PRD. For example, for a wireless earbud and a case, the case may provide power and data over the power line to the earbud, and the earbud may also provide power and data over the power line to the case. By transmitting the data over the power line, a minimal number of device contacts may be used, thereby providing for efficiency in manufacture, better reliability and ease of use. Moreover, a differential mode direct binary phase shift keying provides increased noise immunity.

Example Systems

FIG. 1 illustrates an example of a first electronic device 110 which supplies power to a second electronic device 130. For example, the first electronic device 110 includes a power source, such as a battery 112, which can supply a charge to battery 132 of the second electronic device 130. The first and second electronic devices 110, 130 may be electronically coupled, for example, via power line 150 and ground line 160. While the power and ground lines 150, 160 are shown as a line between the two device, it should be understood that each of the first and second electronic devices 110, 130 may include its own power line and ground line, terminating in contacts, and that the electronic coupling of the two devices may be formed when the contacts on the first electronic device 110 meet the contacts of the second electronic device 130.

The charge from the first device 110 to the second device 130 may be supplied through the power line 150. While the power is shown as being transmitted in one direction, in other examples the power may be supplied from either device to the other, for example, depending on user input or detected conditions. As shown in FIG. 1, data may also be supplied from the first electronic device 110 to the second electronic device 130, and from the second electronic device 130 to the first electronic device 110, over the power line 150. The data may include any kind of information, such as battery levels, song titles, software updates, just to name a few. In some examples, the transmission of data over the power line 150 may be disabled, separately from the transmission of power.

Figure 2:
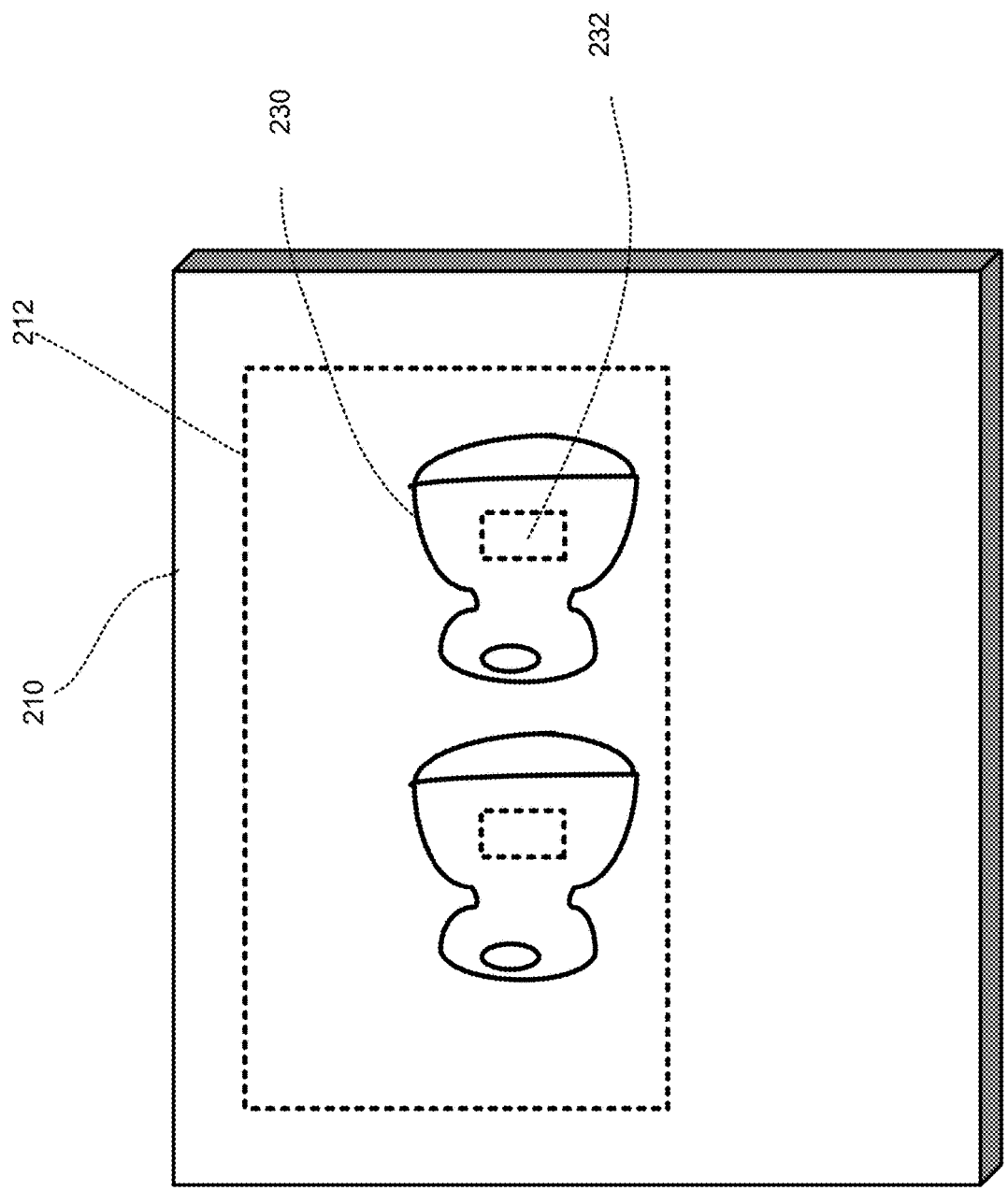
FIG. 2 is an example pictorial diagram of the system of FIG. 1.

FIG. 2 provides a pictorial diagram illustrating an example of the devices of FIG. 1. As shown in this example, the first electronic device is a case 210 and the second electronic device is a pair of earbuds 230. The earbuds 230 may be wireless in that they do not require a wired connection to a music player, phone, or other device to be powered. The earbuds 230 include one or more batteries 232 which provide power to the earbuds 230 and other components therein, such as transmitters, receivers, amplifiers, etc. The batteries 232 of the earbuds 230 may be relatively small, in view of the small size of the earbuds 230. The case 210 in which the earbuds 230 are shipped and stored may have a larger battery 212. This larger battery 212 of the case 210 may deliver a charge to the smaller batteries 232 of the earbuds 230.

When the earbuds 230 are placed inside the case 210 in a given orientation, contacts (not shown) on the earbuds 230 may come into contact with contacts on the case 210 to establish an electrical connection, including a power line connection and a ground line connection. In some examples, each earbud may operate independently, and thus power and ground line connections are established with a first earbud, while separate power and ground line connections are established with a second earbud. Accordingly, the case 210 may supply power to the earbuds 230, as well as supplying data to the earbuds 230 over the power line. The earbuds 230 may also provide data over the power line to the case 210. In some instances, the earbuds 230 may even provide power to the case 210.

While the example of FIG. 2 illustrates the first electronic device as a case and the second electronic device as an earbud, it should be understood that the transfer of data over a power line may be implemented in any of a variety of devices. By way of example only, the electronic devices may include any of a phone, phone accessories, smartwatch, toys, gaming systems, tablets, etc.

Figure 3:
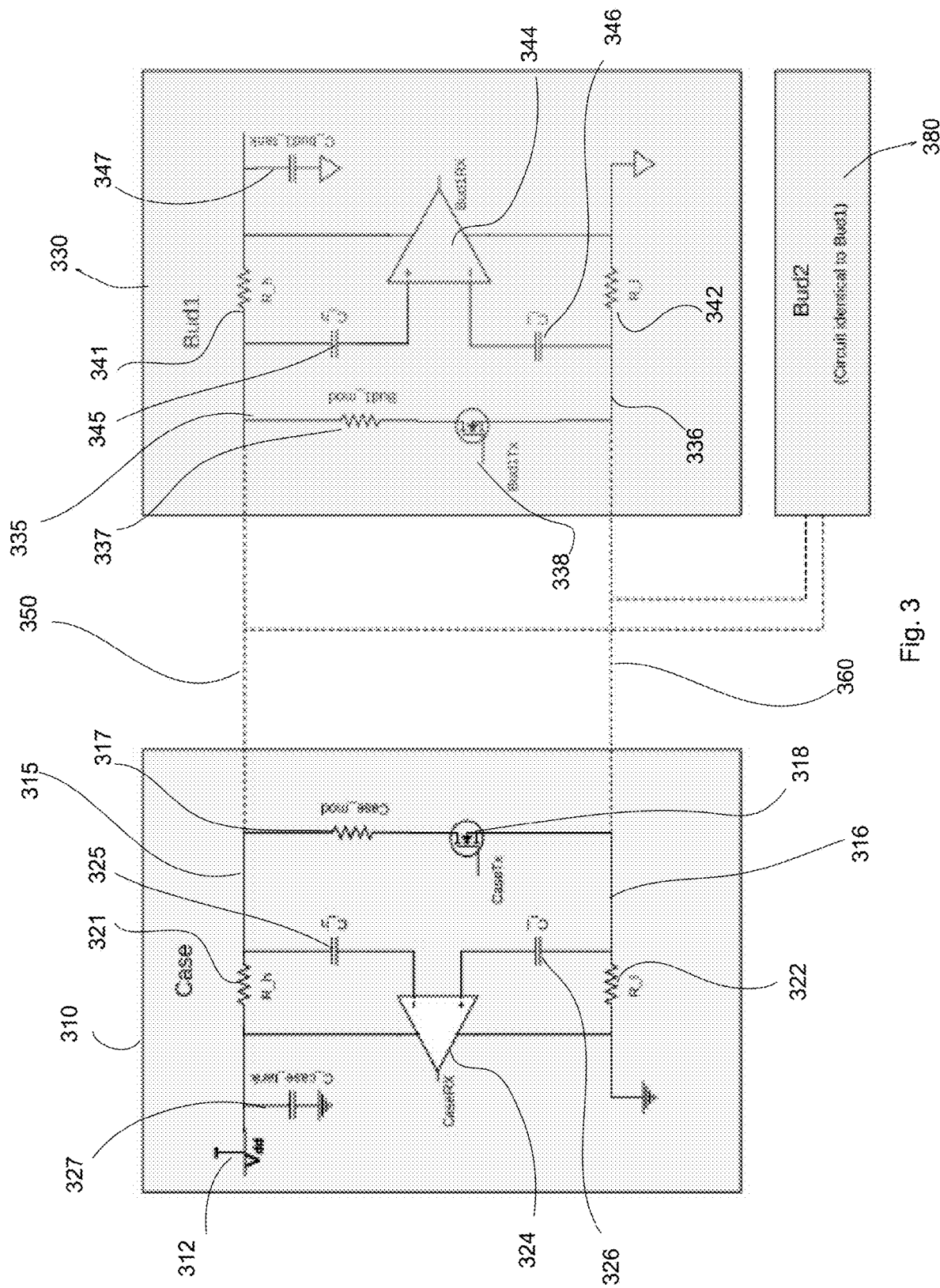
FIG. 3 is an example circuit diagram of the system of FIG. 1.

FIG. 3 provides a circuit diagram illustrating a circuit design of the first electronic device and the second electronic device. While in this example first device 310 is labeled as a case and second device 330 is labeled as an earbud, as mentioned above the first and second devices may be any of a variety of types of devices. In this example, first earbud (second device 330) and second earbud 380 are attached to the same bus from the case (first device 310). The earbuds 330, 380 are sharing the same pair of physical lines. Other designs are possible, such as two buses coming out of the case 310, each bus connecting to a specific earbud. Because in this example the internal components of a second earbud 380 are identical to the first earbud (second device 330), only the circuitry of the first earbud is shown for simplicity.

The first device 310 includes a power source 312 with a power line 315 extending therefrom. It further includes a ground with ground line 316. A first resistive impedance 321 is inserted into the power source line 315, and second resistive impedance 322 is inserted to power return ground 316. The first and second resistive impedances 321, 322 may have the same resistive values, for example, 0.2 ohm. In other examples, the first resistive impedance 321 may have a different value than the second resistive impedance 322. The first impedance 321 and second impedance 322 can be up to 10% of a load resistance, where the load is connected in parallel with tank capacitor 347. This will keep power loss below 10% when the first impedance 321 and second impedance 322 are inserted. Accordingly, when the load (not shown) is on, there is 0.1%-10% voltage drop across the first and second impedances 321, 322.

The second device 330 includes circuitry which corresponds to that of the first device 310. For example, the circuitry in the second device 330 may be nearly identical to the first device 310. As such, the second device 330 includes a power line 335, a power return ground line 336, with a first impedance 341 inserted into the power line 335 and a second impedance 342 inserted into the ground line 336. The first and second impedances 341, 342 on the second device may have the same values as those on the first device, or different values.

The first device 310 and the second device 330 should both see stable voltage. In some examples, the power source line 315 on the first device may further include a tank capacitor 327, and the power source line 335 on the second device may further include a tank capacitor 347. The tank capacitors 327, 347 help to stabilize the voltage across the power line. When data is being transmitted across the power line, a spiky current is pulled by a MOSFET of the transmitting device. Each tank capacitor 327, 347 may be big enough that when the data is being transmitted, the ripple signal is trapped only between the first impedances 321, 341 of the first and second devices on the power line, and between the second impedance 322, 342 on the ground line, respectively. Accordingly, a minimum value of the tank capacitors 327, 347 should be such that no significant signal can pass beyond the first and second impedances. A net signal is trapped and fed into op-amp 324, 344.

The tank capacitors 327, 347 values, time first impedance 321, 341 values will determine a PSD and PRD time constant. The time constants are bigger than the transmission bits period. Therefore the tank capacitors 327, 347 act as "reservoir" capacitance, to hold the power voltage at op-amps 324, 344 steady during communication of data.

The first and second impedances create a voltage drop across the first and second impedances themselves. For example, in the first device 310, a modulator impedance 317 and field effect transistor (FET) 318 are positioned between the first impedance (R_h) 321 and the second impedance (R_l) 322. Similarly, in the second device 330, a modulator impedance 337 and FET 338 are positioned between the first impedance (R_h) 341 and the second impedance (R_l) 342.

In some examples, only impedances 321 and 341 may be added to the power lines 315, 335, instead of both power lines and ground lines. This however will not create a differential signal. The first and second impedances allow a modulation signal in the FETs, creating a voltage dip across the first and second impedances. For example, when data is transmitted from the second device 330 to the first device 310, the modulator impedance 337 and FET 338 create current fluctuations in the power line 335 when driven. The differential voltage dips across the first and second impedances 321, 322 on the first device side are picked up by comparator 324. Likewise, when data is transmitted from the first device 310 to the second device 330, the modulator impedance 317 and FET 318 create current fluctuations in the power line 315 when driven. The differential voltage dips across the first and second impedances 341, 342 on the second device side are picked up by comparator 344.

To save additional power, the first impedances and second impedances may be shorted out during times when communication is not active. For example, a manual switch or MOSFET may be implemented. In some examples, the switch may automatically short out the added impedances in response to detected conditions. For example, if the power in one of the devices is low, the added impedances may be shorted out such that data is no longer transmitted by that device. When the conditions change, such as if the charge in the low power device increases above a predetermined threshold, the devices may return to a data transmission mode. In other examples, data may be transmitted in intervals, and data communication may be switched off between intervals. For example, in a is interval, data may be transmitted in a first 1 ms of the interval. The data communication may be switched off for the next 999 ms, and then switch back on for the next interval.

Figure 4:
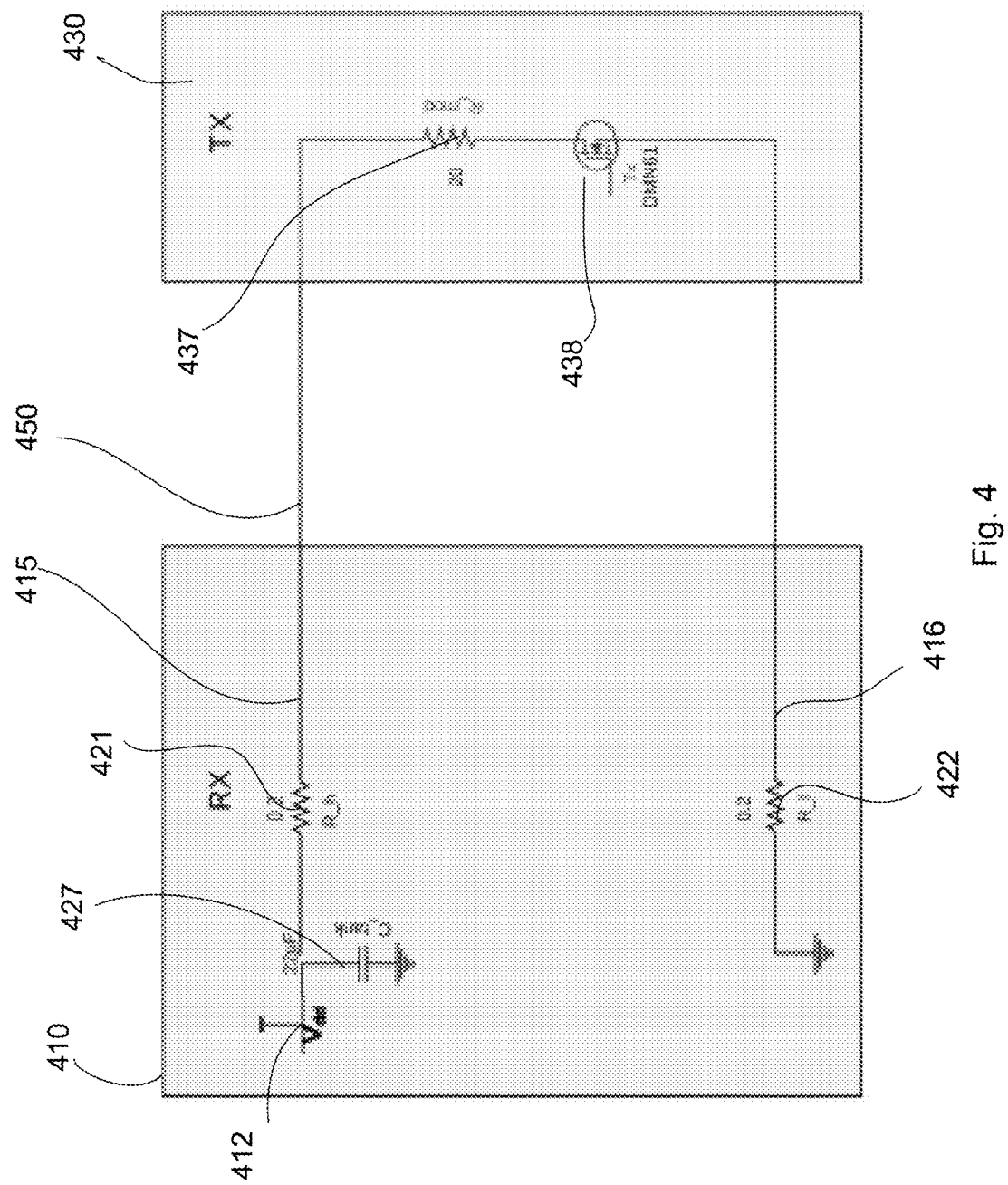
FIG. 4 is a detailed circuit diagram of PRD as transmitter (TX), and PSD as receiver (RX) in the system of FIG. 1, and TX is transmitting.

FIG. 4 illustrates a simplified view of the second device 430, operating in the transmitting mode. A power originates at power source 412 at the first device 410, flows through power line 450 to the second device 430, and returns to ground at the first device 410. Tank capacitor 427 at the first device holds the voltage across the power source 412 steady. The tank capacitor 427 may be, for example, a large and low ESR capacitor. The first and second resistors 421, 422 inserted into the power line and ground line, form line impedance. The resistors 421, 422 may be relatively small. The tank capacitor 427 together with first and second impedance 421 and 422 determine a source time constant. Modulator impedance 437 and transmission FET 438 create current fluctuation in the power loop when driven. Accordingly, a small voltage is developed at the first and second impedances 421, 422 on the receiving side.

Data bits transmitted or received by the first or second devices 410, 430 may be encoded. For example, an encoding scheme, such as Manchester code, may be used for ease of communication and clock recovery. For example, for encoding, the data may be XOR'd with a clock, such that a bit value rises from 0 to 1 at bit start, and from 1 to 0 at midbit. For decoding, data bits are set at ¼ of the incoming bit stream. The clock is delayed by ¾ bit period, then XOR'd with data to recreate the data.

By way of example only, a clock may provide pulses at 200 kbps or 100 kbps. As the data is XOR'd with the clock, the pulse widths may be 5 or 10 μs. Encoding or decoding can be performed using, for example, programmable system-on-chips, microcontrollers, or the like. A signal detection comparator at the PRD may create an output, demodulate Manchester coding, and restore the signal and clock. The comparator can be powered directly from power and ground lines 415, 416.

Figure 5:
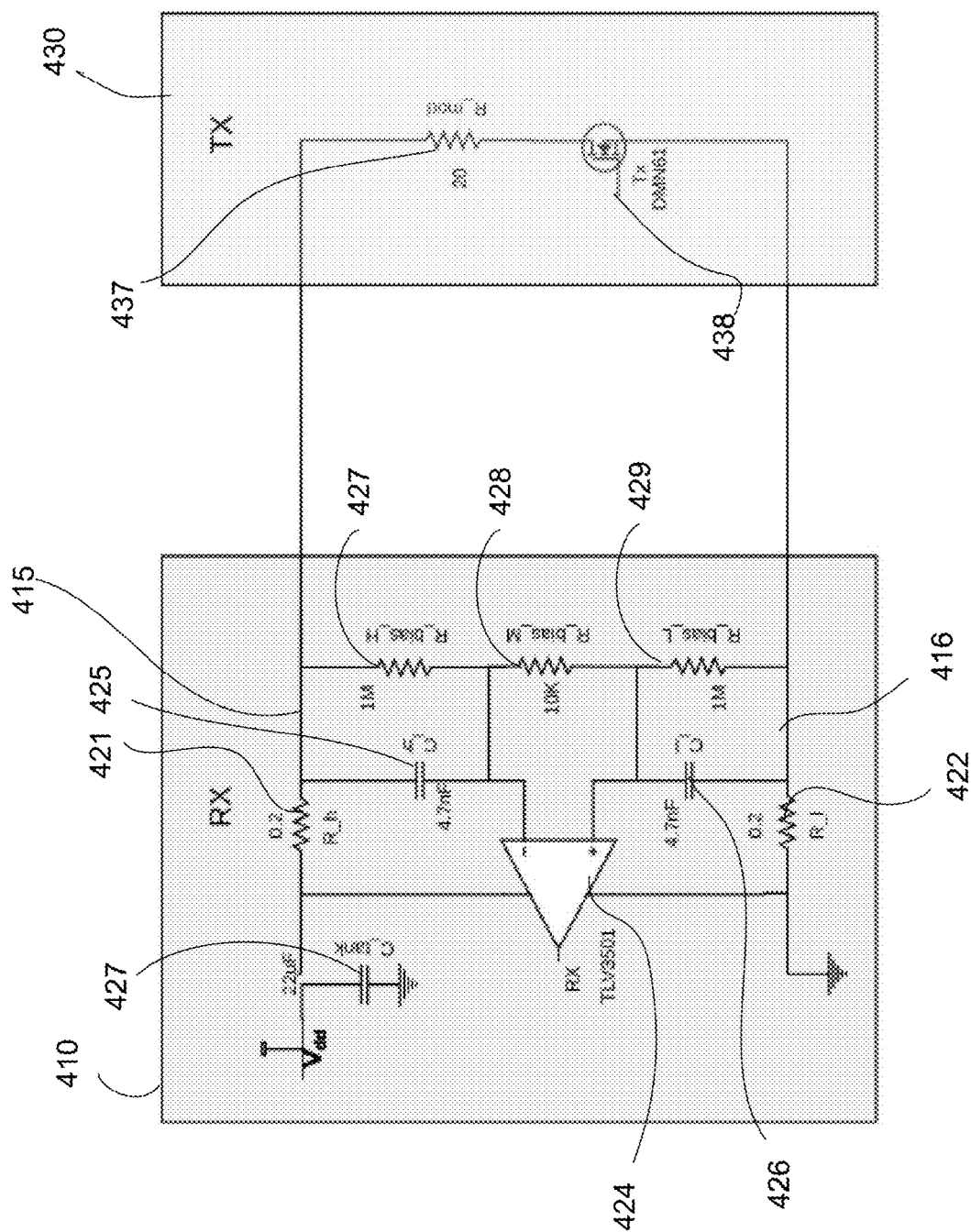
FIG. 5 is a detailed circuit diagram of an electronic device in the system of FIG. 1, when PRD is a transmitter (TX), and PSD is a receiver (RX).

FIG. 5 illustrates in further detail the first device 410, which in this example is the PSD, operating in data receiving mode. For simplicity, this example shows components in the first device 410 for receiving data communications from second device 430, and components in the second device 430 for transmitting the data. On the transmitter side, modulator impedance 437 is included along with the FET transistor 438. As shown, impedance R_h 421 is inserted into power line 415 and impedance R_l 422 is inserted into ground line 416 on the communication receiver side. To send a signal, digital bits are fed into a gate of the FET transistor 438, which creates current surges in a path of the modulator impedance 437 and the FET transistor 438. Current fluctuations in the power line 415 create ripples across first and second impedances, 421, 422. The power line 415 is input to a comparator 424 in the receiver.

Additional resistance may be added between the two added impedances 421, 422 to ensure that the comparator 424 is properly biased. For example, as shown resistors R_bias_H 427, R_bias_M 428, and R_bias_L 429 are added. These additional resistors 427-429 set comparator external bias points. The input bias may be, for example, approximately 15-20 mV across 428. By way of example only, the internal offset for comparator 424 may be approximately 10 pA, while the bias for the resistors R_bias_H 427 and R_bias_L 429 may be 1M each. A bias threshold may be approximately 20 mV, with 10 mV hysteresis. Bias of resistor R_bias_M 428 may be, for example, approximately 10K. It should be understood that these values are provided by way of example, describing an example relationship between circuit components. The values of each of the components may be adjusted upwards or downwards, independently or in relation to the other components.

Capacitors 425, 426 form a high pass filter with the R_bias_H/L resistors 427, 429. The high pass filter may have a time constant longer than 10× of the communication bit rate. As such, signals of a predetermined frequency are allowed to pass. By way of example only, signals of approximately 200 kbps may be allowed to pass. Comparator 424 creates the output, to feed into decoder to restore the clock and data. While any of a variety of schemes may be used, differential scheme may provide better common mode noise rejection.

A driving current of the transmitter may be, for example, approximately 200 mA. Transmission line impedance may be approximately 0.2 ohm, or 40 mV on each sampling resistor when driven. A max transmission pulse width may be, for example, approximately 100K or 5 μs. Tank capacitor 427 may correspond to the max transmission pulse width and the transmission line impedance. For example, dividing the max transmission pulse width by the transmission line impedance may result in a tank capacitor value of approximately 25 μF.

While the examples above describe communication from the second device 430 to the first device 410, data may also be transmitted in the opposite direction, from the first device 410 to the second device 430. For example, while particular circuitry within the first and second devices 410, 430 were described in detail, each device may have the same circuit design, such that two-way communication is possible between the two devices.

Figure 6:
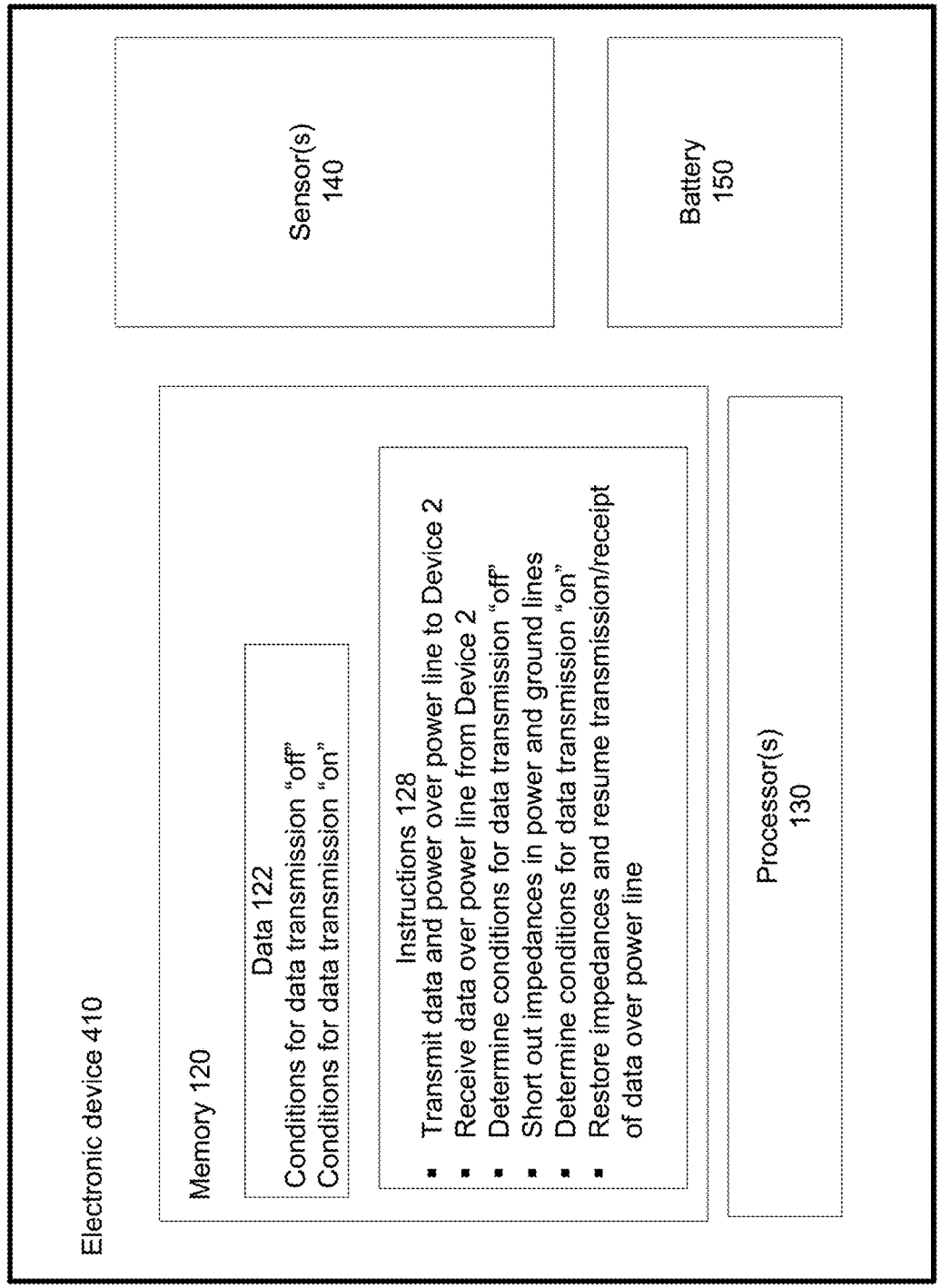
FIG. 6 is a block diagram illustrating an example device according to aspects of the disclosure.

As mentioned above, the first impedances and second impedances 421, 422 may be shorted in some instances, for example, when data communication is not needed. FIG. 6 illustrates an example electronic device 410 adapted to detect predetermined conditions, and to short out the impedances in response, thereby disabling data communication over the power line between the first device and a second device.

The electronic device 410 may include one or more processors 630, one or more memories 620, as well as other components. For example, the computing device 410 may include one or more sensors 640 and a battery 650.

The memory 620 may store information accessible by the one or more processors 630, including data 622 instructions 628 that may be executed or otherwise used by the one or more processors 630. For example, memory 620 may be of any type capable of storing information accessible by the processor(s), including a computing device-readable medium, or other medium that stores data that may be read with the aid of an electronic device, such as a volatile memory, non-volatile as well as other write-capable and read-only memories. By way of example only, memory 620 may be a static random-access memory (SRAM) configured to provide fast lookups. Systems and methods may include different combinations of the foregoing, whereby different portions of the instructions and data are stored on different types of media.

The data 622 may be retrieved, stored or modified by the one or more processors 630 in accordance with the instructions 628. For instance, data 622 may include an identification of conditions which indicate either that the device 410 should be in a first state or a second state. By way of example only, a first set of conditions may indicate that the device 410 should be in a communication state, where transmission of data over the power line is enabled. A second set of conditions, however, may indicate that the device 410 should be in a non-communication state, where communication of data over the power line is disabled. In accordance with the instructions 628, the device detects conditions surrounding the device, such as by using the one or more sensors 640, and remains in or switches to a corresponding mode. Although the claimed subject matter is not limited by any particular data structure, the data may be stored in computing device registers, in a relational database as a table having a plurality of different fields and records, XML documents or flat files. The data may also be formatted in any computing device-readable format.

The instructions 628 may be any set of instructions to be executed directly (such as machine code) or indirectly (such as scripts) by the one or more processors 630. For example, the instructions may be stored as computing device code on the computing device-readable medium. In that regard, the terms "instructions" and "programs" may be used interchangeably herein. The instructions may be stored in object code format for direct processing by the processor, or in any other computing device language including scripts or collections of independent source code modules that are interpreted on demand or compiled in advance. Functions, methods and routines of the instructions are explained in more detail below.

The one or more processors 630 may be microprocessors, logic circuitry (e.g., logic gates, flip-flops, etc.) hard-wired into the device 410 itself, or may be a dedicated application specific integrated circuit (ASIC). It should be understood that the one or more processors 630 are not limited to hard-wired logic circuitry, but may also include any commercially available processing unit, or any hardware-based processors, such as a field programmable gate array (FPGA). In some examples, the one or more processors 630 may include a state machine.

The one or more sensors 640 may include any of a variety of mechanical or electromechanical sensors, such as an accelerometer, gyroscope, magnetic sensor, switch, light sensor, barometer, audio sensor (e.g., microphone), vibration sensor, heat sensor, radio frequency (RF) sensor, etc. In this regard, the device 410 may detect the predetermined conditions.

A default mode of the device 410 may be to transmit and receive data over the power line to/from a second device. However, upon detection of the predetermined condition, the impedances in the power line may be shorted and communication of data may thereby be disabled. During this time, the device 410 may continue to detect surrounding conditions, and determine whether any predetermined conditions for restoring communications are met. If so, the device 410 may automatically switch to communication mode, where data may be transmitted over the power line.

Example Methods

In addition to the operations described in connection with the systems above, various operations will now be described in connection with example methods. It should be understood that the following operations do not have to be performed in the precise order described below. Rather, various operations can be handled in a different order or simultaneously, and operations may also be added or omitted.

Figure 7:
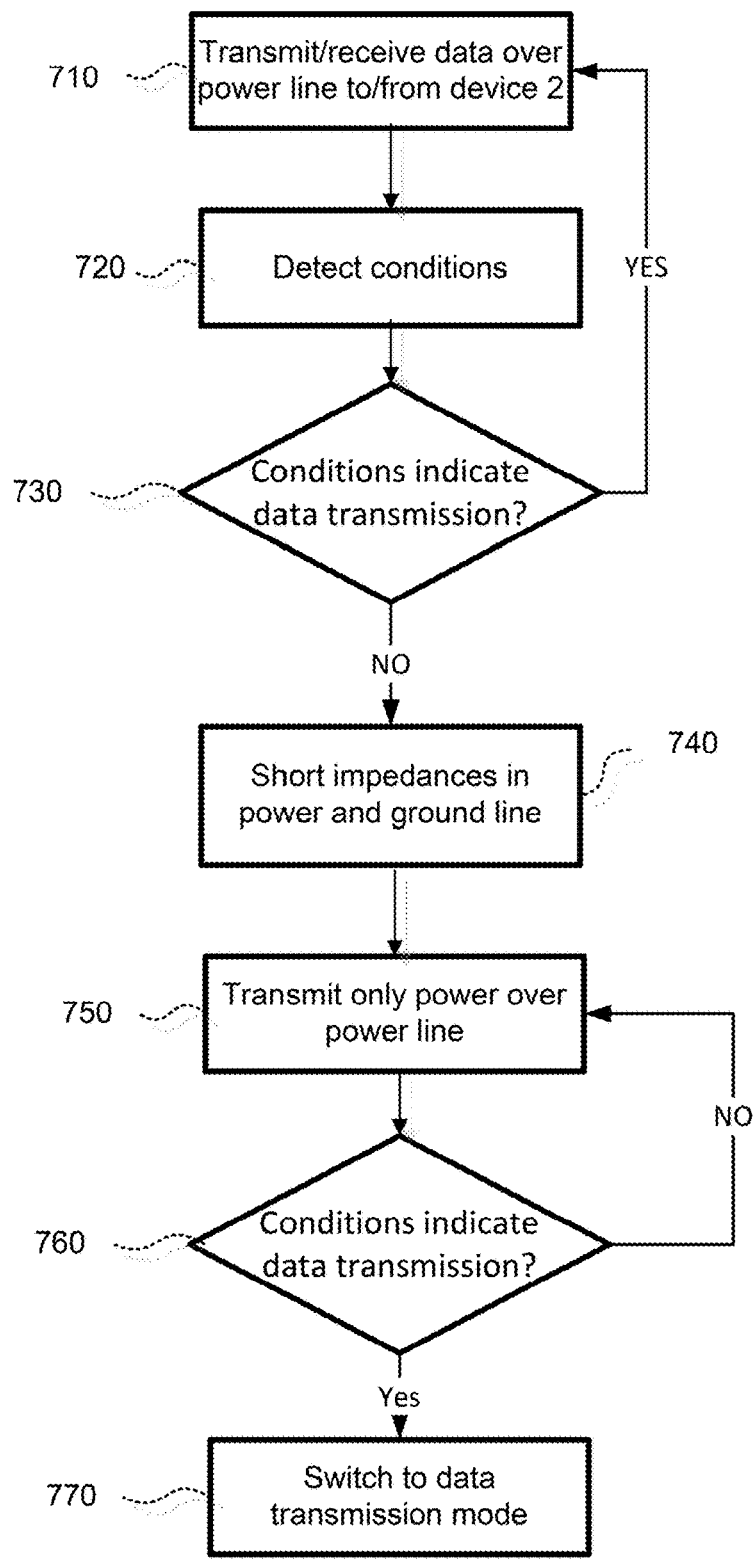
FIG. 7 is a flow diagram illustrating an example method according to aspects of the disclosure.

FIG. 7 provides a flow diagram illustrating an example method 700 of enabling and disabling communication of data over a power line between two devices. The devices may include any type of electronic devices, such as earbuds, a phone, phone accessories, toys, gaming systems, tablets, etc.

In block 710, a first device transmits data to a second device over a power line and/or receives data from the second device over the power line, for example, as described above in connection with FIGS. 3-5.

In block 720, the first device detects conditions. For example, the conditions may include battery levels, communication needs, device activity, etc. Communication needs may include considerations such as predetermined timeframes for communication, data in a buffer to be transmitted, or the like. Device activity may include activity indicating whether the device is in use, whether it is stored in a place not likely to be accessed by a user for a period of time, etc. In some examples, the conditions may relate to time. For example, if the device transmits data at the beginning of a predetermined time interval, the condition may include whether it is time to transmit the data or not.

In block 730, the device determines whether the conditions indicate that the device should transmit data over the power line. If so, the device may continue to transmit and receive the data over the power line. If not, however, the device may short the impedances in the power and ground line (block 740), thereby disabling data communication. In that case, the device may continue transmitting power only over the power line (block 750).

The device may continue detecting conditions. In block 760, it may again determine whether the conditions indicate data transmission. If not, the method returns to block 750, where the device continues transmitting only power. If so, however, the method proceeds to block 770, where the device switches back to data transmission mode.

By transmitting the data over the power line, a minimal number of device contacts may be used, thereby providing for efficiency in manufacture, better reliability and ease of use. Moreover, direct binary phase shift keying provides increased noise immunity.

While the examples described above primarily relate to earbuds and a case for the earbuds, it should be understood that the data over power line design may be implemented in any of a number of devices. By way of example only, the first device may be a smartwatch, mobile phone, tablet, speaker, microphone, head-mounted display, fitness tracker, or any of a number of other devices. The second device may be, for example, a case, a charging stand, a mobile computing device, or any other type of device capable of transmitting power to the first device.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. A method for providing data over a power connection from a power source device to a mobile device, the method comprising:
    operating the power source device in a first mode, the first mode comprising the power source device transmitting data to or receiving data from the mobile device over a power line, the power line comprising a single electronic connection from a power supply of the power source device to the mobile device;
    detecting, by the power source device at a first time, one or more conditions;

determining, based on the one or more conditions, not to transmit or receive data over the power line; and responsive to at least a level of battery charge in the power source device being under a power level threshold value, switching to a second mode, the second mode comprising:

shorting impedance in the power line; and the power source device not transmitting or receiving data over the power line.

2. The method of claim 1, wherein switching to the second mode further comprises shorting impedance in a ground line, the ground line comprising an electronic connection from a ground of the power source device to a ground of the mobile device.

3. The method of claim 1, further comprising continuing to transmit power over the power line when the power source device is operating in the second mode.

4. The method of claim 1, wherein the one or more conditions include at least one of battery levels or time intervals.

5. The method of claim 1, wherein the one or more conditions include communication needs, the communication needs comprising at least one of predetermined timeframes for communication or data in a buffer to be transmitted.

6. The method of claim 1, wherein the one or more conditions include power source device activity.

7. The method of claim 1, further comprising:

detecting, by the power source device at a second time later than the first time when the power source device is operating in the second mode, the one or more conditions;

determining, by the power source device operating in the second mode, whether to resume transmission or reception of data over the power line based on the one or more conditions detected at the second time; and switching back to the operating in the first mode when the one or more conditions detected at the second time indicate data transmission or reception.

8. A method for receiving data at a mobile device from a power source device over a power line between the power source device and the mobile device, the power line comprising a single electronic connection from the power source device to the mobile device, the method comprising:

operating the mobile device in a first mode, wherein in the first mode the mobile device transmits or receives data from the power source device over the power line, the electronic connection from the power source device to the mobile device established by contacts on the power source device in contact with contacts on the mobile device;

detecting, by the mobile device at a first time, one or more conditions;

determining, based on the one or more conditions, not to transmit or receive data over the power line; and responsive to at least a level of battery charge in the power source device being under a power level threshold value, switching to a second mode, the second mode comprising:

shorting impedance in the power line; and the mobile device not transmitting or receiving data over the power line.

9. The method of claim 8, wherein switching to the second mode further comprises shorting impedance in a ground line, the ground line comprising an electronic connection from a ground of the power source device to a ground of the mobile device.

10. The method of claim 8, further comprising continuing to receive power over the power line when the mobile device is operating in the second mode.

11. The method of claim 8, wherein the one or more conditions include at least one of battery levels or time intervals.

12. The method of claim 8, wherein the one or more conditions include communication needs, the communication needs comprising at least one of predetermined timeframes for communication or data in a buffer to be transmitted.

13. The method of claim 8, wherein the one or more conditions include mobile device activity, wherein the mobile device activity comprises at least one of activity indicating usage of the mobile device or activity indicating whether the mobile device is stored in a place not likely to be accessed by a user for a period of time.

14. The method of claim 8, further comprising:

detecting, by the mobile device at a second time later than the first time when the mobile device is operating in the second mode, the one or more conditions;

determining, by the mobile device operating in the second mode, whether to resume transmission or receipt of data over the power line based on the one or more conditions detected at the second time; and switching back to the operating in the first mode when the one or more conditions detected at the second time indicate data transmission or receipt.

15. A method for exchanging data between a mobile device and a power source device over a power line between the power source device and the mobile device, the power line comprising a single electronic connection from the power source device to the mobile device, the method comprising:

operating the mobile device and the power source device in a first mode, wherein in the first mode the mobile device and power source device exchange data over the power line the electronic connection from the power source device to the mobile device established by contacts on the power source device in contact with contacts on the mobile device;

detecting, by at least one of the power source device or the mobile device at a first time, one or more conditions;

determining, based on the one or more conditions, not to exchange data over the power line; and responsive to at least a level of battery charge in the power source device being under a power level threshold value, switching to a second mode, the second mode comprising:

shorting impedance in the power line;

the mobile device and power source device not exchanging data over the power line; and the power source device supplying power to the mobile device over the power line.

16. The method of claim 15, further comprising:

detecting, at a second time later than the first time when the power source device and mobile device are operating in the second mode, the one or more conditions;

determining, whether to resume exchange of data over the power line based on the one or more conditions detected at the second time; and switching back to the operating in the first mode when the one or more conditions detected at the second time indicate exchange of data.

* * * * *